(12) United States Patent
Orr et al.

(10) Patent No.: US 7,679,916 B2
(45) Date of Patent: Mar. 16, 2010

(54) METHOD AND SYSTEM FOR EXTRACTING HEAT FROM ELECTRICAL COMPONENTS

(75) Inventors: Chris Erwin Orr, Huntsville, AL (US); David S. Slaton, Huntsville, AL (US)

(73) Assignee: GE Intelligent Platforms Embedded Systems, Inc., Charlottesville, VA (US)

( * ) Notice: Subject to any disclaimer, the term of this patent is extended or adjusted under 35 U.S.C. 154(b) by 0 days.

(21) Appl. No.: 11/608,384

(22) Filed: Dec. 8, 2006

(65) Prior Publication Data

US 2008/0137307 A1 Jun. 12, 2008

(51) Int. Cl.
*H05K 7/20* (2006.01)
(52) U.S. Cl. ................ 361/719; 361/699; 361/701; 361/702; 361/703
(58) Field of Classification Search .......... 361/699, 361/701–703, 719; 165/80.4, 104.33; 174/15.1, 174/252; 438/122
See application file for complete search history.

(56) References Cited

U.S. PATENT DOCUMENTS

| | | | |
|---|---|---|---|
| 4,327,399 A | 4/1982 | Sasaki et al. | |
| 4,631,636 A * | 12/1986 | Andrews | 361/699 |
| 4,718,163 A * | 1/1988 | Berland et al. | 29/837 |
| 4,729,061 A | 3/1988 | Brown | |
| 4,851,615 A * | 7/1989 | Butt | 174/250 |
| 4,953,060 A | 8/1990 | Lauffer et al. | |
| 5,142,441 A * | 8/1992 | Seibold et al. | 361/689 |
| 5,262,922 A | 11/1993 | Yamaji et al. | |
| 5,313,361 A * | 5/1994 | Martin | 361/699 |
| 5,339,519 A | 8/1994 | Fortune | |
| 5,467,251 A | 11/1995 | Katchmar | |
| 5,510,958 A | 4/1996 | Shimabara et al. | |
| 5,661,902 A | 9/1997 | Katchmar | |
| 5,763,951 A * | 6/1998 | Hamilton et al. | 257/714 |
| 5,818,692 A * | 10/1998 | Denney et al. | 361/699 |
| 5,870,823 A | 2/1999 | Bezama et al. | |
| 5,901,037 A * | 5/1999 | Hamilton et al. | 361/699 |
| 5,929,518 A * | 7/1999 | Schlaiss | 257/712 |
| 6,226,178 B1 | 5/2001 | Broder et al. | |
| 6,304,450 B1 | 10/2001 | Dibene, II et al. | |
| 6,377,457 B1 * | 4/2002 | Seshan et al. | 361/690 |
| 6,490,159 B1 * | 12/2002 | Goenka et al. | 361/700 |
| 6,501,564 B1 * | 12/2002 | Schramm et al. | 358/1.9 |

(Continued)

FOREIGN PATENT DOCUMENTS

EP 1628515 A 2/2006
WO WO2004/027336 A 4/2004

OTHER PUBLICATIONS

"Edge Cooling" (http://www.frigprim.com/articels4/Edgecoolingn.html).

(Continued)

*Primary Examiner*—Anatoly Vortman
(74) *Attorney, Agent, or Firm*—GE Global Patent Operations

(57) ABSTRACT

A system for extracting heat from an electronic device is provided. The system includes heat dissipation means positioned within a printed circuit board to form an in-board heat sink structure and a fluid heat transfer medium disposed in the heat dissipation means. The medium circulates through the heat dissipation means carrying heat away from the electronic device.

19 Claims, 5 Drawing Sheets

U.S. PATENT DOCUMENTS

| | | | |
|---|---|---|---|
| 6,665,185 B1 * | 12/2003 | Kulik et al. | 361/699 |
| 7,110,258 B2 * | 9/2006 | Ding et al. | 361/699 |
| 7,176,382 B1 * | 2/2007 | Shi et al. | 174/254 |
| 7,215,547 B2 * | 5/2007 | Chang et al. | 361/701 |
| 7,269,005 B2 | 9/2007 | Pokharna et al. | |
| 7,298,623 B1 * | 11/2007 | Kuczynski et al. | 361/719 |
| 2002/0039280 A1 | 4/2002 | O'Conner et al. | |
| 2002/0185718 A1 | 12/2002 | Mikubo et al. | |
| 2005/0238567 A1 * | 10/2005 | Sunkara et al. | 423/447.3 |
| 2006/0249279 A1 * | 11/2006 | Chordia et al. | 165/80.4 |

OTHER PUBLICATIONS

"Thermal and High Current Multilayer Printed Circuit Boards With Thermagon T-lam and Hybrid Boards" (Courtney R. Furnival, Thermagon, Jan. 31, 2001).

"STABLCOR®: Groundbreaking PCB and substrate material" (Carol Burch & Kris Vasoya, VMEbus Systems, Apr. 2005).

"Thermal Substrates: T-Clad" (http://www.bergquistcompany.com/ts_thermal_clad.cfm), 2007.

"UltraTemp™ Technology Overview" (http://www.heattechnology.com/ultratemp.htm), 2004/2005.

Malhammar, Ake, "Edge Cooling," http://www.frigprim.com/articels4/Edgecoolingn.html, Paris, France.

Furnival, Courtney R., "Thermal and High Current Multilayer Printed Circuit Boards With Thermagon T-lam and Hybrid Boards," http://www.thermagon.com/pdf/MultilayerApplicationGuide.pdf, Jan. 31, 2001, Thermagon, Inc.

Burch, Carol and Vasoya, Kris, "STABLCOR: Groundbreaking PCB and substrate material," http://www.vmecritical.com/articles/id/?774, Apr. 2005, VMEbus Systems, St. Clair Shores, MI, USA.

"Thermal Substrates: T-Clad," http://www.bergquistcompany.com/ts_thermal_clad.cfm, The Bergquist Company, Chanhassen, MN, USA, 2008.

UltraTemp Technology Overview, http://www.heattechnology.com/ultratemp.htm, Heat Technology Inc., Sterling, MA, USA.

* cited by examiner

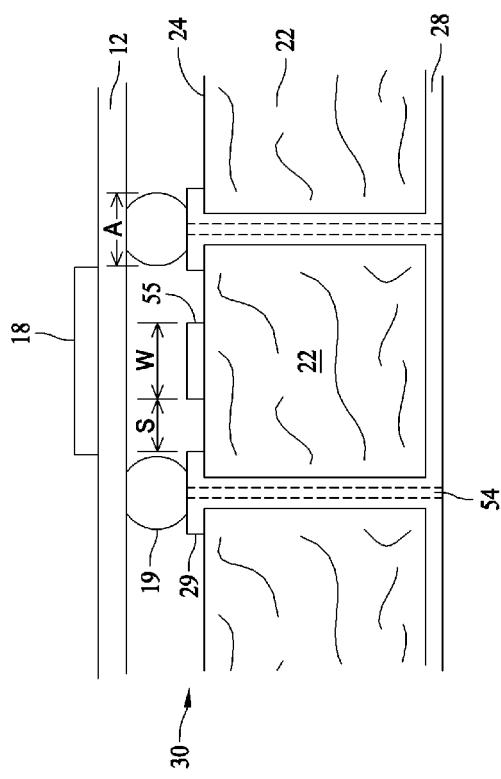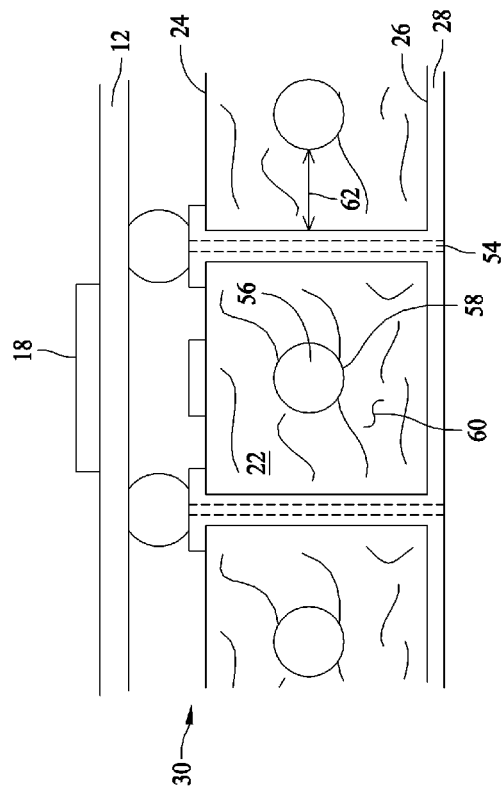

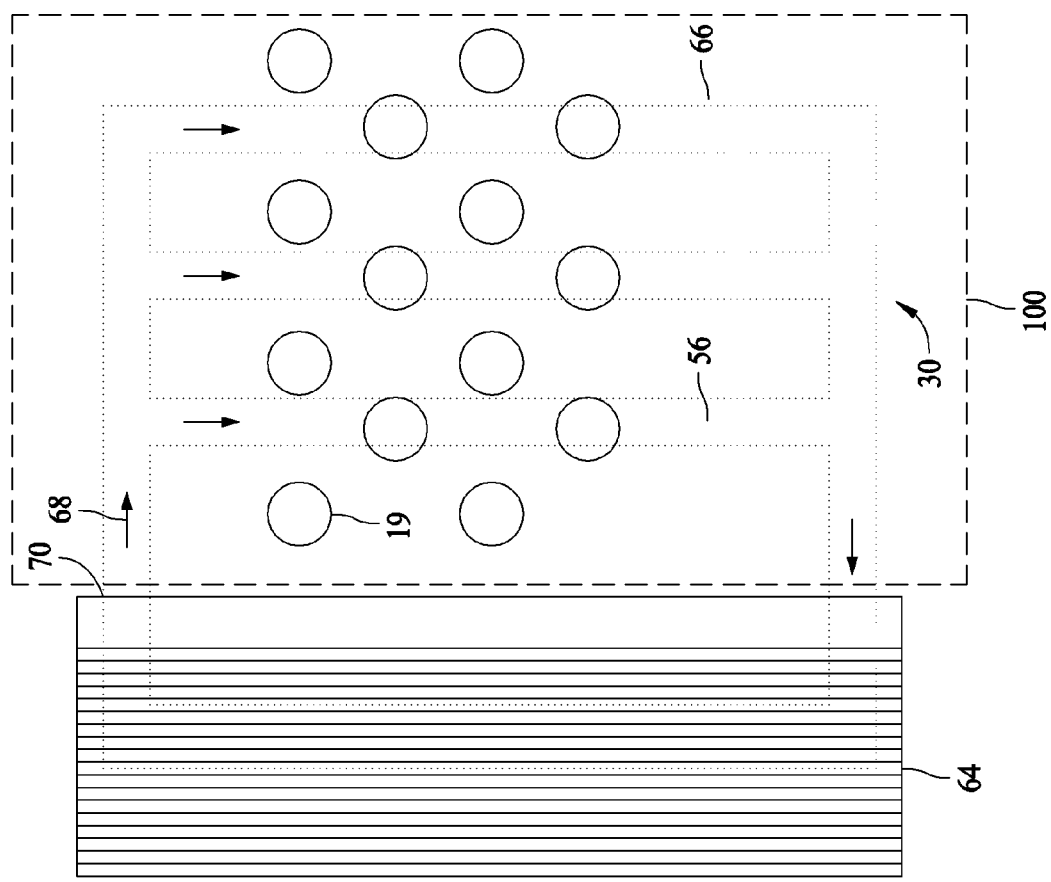

METHOD AND SYSTEM FOR EXTRACTING HEAT FROM ELECTRICAL COMPONENTS

BACKGROUND OF THE INVENTION

This invention relates generally to extracting heat from an electronic system, and more particularly, to extracting heat from a printed circuit board (PCB) using a heat transfer system embedded in the PCB.

Embedded computer systems contain very high power electrical components, typically associated with but not limited to central processing units (CPUs), in a volumetrically constrained environment. The volumes typically do not change as the power dissipation of the components increases, presenting significant challenges in the management of component temperatures. Active and passive heat-sinks comprised of highly thermally conducting materials such as aluminum and copper have been used to cool the components. As the power dissipation of the components increases, hotspots on the PCB develop which further complicates thermal management. One way of controlling hotspots is to facilitate the movement of heat from the hotspot to a more advantageously located heat-sink. This is traditionally done using heat-pipes. Heat-pipes are liquid filled tubes for transferring heat from one end of the tube to the other end of the tube. Hotspots may also be controlled by distributing the heat across more surface area of the PCB. This is done by dedicating layers of copper in the PCB for conducting heat from the component and throughout the PCB. The copper layers are also the electrical ground plane for the electronic circuits on the PCB and the heat is conducted to this layer of copper from the electrical component by way of vias. Unfortunately, as power dissipation increases, additional layers of copper are required for conducting heat from the component, leaving less area for trace routing for electrical signals in the design.

Existing systems for removing heat from a device on a PCB and spreading it across the PCB or moving it to a heat-sink located elsewhere on the PCB have disadvantages. These systems have to dedicate portions of the available volume for heat-pipe mechanisms. They also require direct contact of the device to a heat-sink, sometimes through cut-outs in the PCB, reducing available PCB area. Further, they require using copper planes for conducting heat which consumes PCB routing areas.

BRIEF DESCRIPTION OF THE INVENTION

In one aspect, a system for extracting heat from an electronic device is provided. The system includes heat dissipation means positioned within a printed circuit board to form an in-board heat sink structure and a fluid heat transfer medium disposed in the heat dissipation means. The medium circulates through the heat dissipation means carrying heat away from the electronic device.

In another aspect, a method for extracting heat from an electronic device is provided. The method includes positioning heat dissipation means within a printed circuit board to form an in-board heat sink structure and disposing a fluid heat transfer medium in the heat dissipation means, wherein the fluid circulates through the heat dissipation means and into a heat sink.

In yet another aspect, a heat dissipation system is provided. The system includes heat dissipation means positioned within a printed circuit board and a fluid transfer medium disposed in the heat dissipation means. The fluid circulates through the heat dissipation means and into a heat sink.

BRIEF DESCRIPTION OF THE DRAWINGS

FIG. 5 shows a blown-up cross-sectional view of the first assembly;
FIG. 6 shows a blown-up cross-sectional view of the first assembly, including a plurality of nano-tubes;
FIG. 7 shows a top view of the first assembly, including a nano-tube system and a heat-sink.

DETAILED DESCRIPTION OF THE INVENTION

Figure 1:
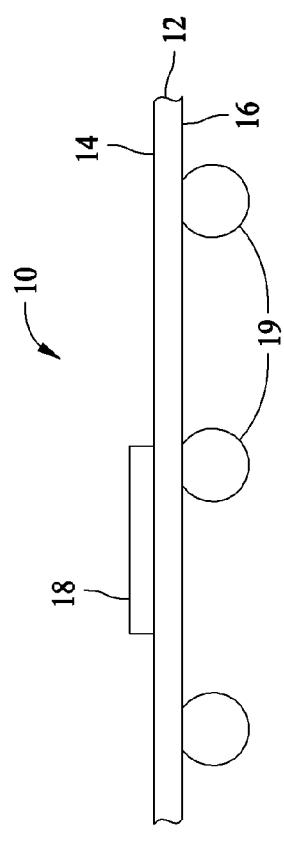
FIG. 1 shows a ball grid arrays (BGA) package.

FIG. 1 shows a ball grid array (BGA) package 10 including at least one substrate 12 having a top surface 14 and a bottom surface 16. In the exemplary embodiment, an electronic device 18, such as a semiconductor chip, is attached to top surface 14 of substrate 12 and a plurality of solder balls 19 are disposed on bottom surface 16 of substrate 12. It should be appreciated that although the exemplary embodiment is described using a BGA package 10, other embodiments may use any kind of heat-generating device that may be present in an embedded computing system or other system having printed circuit boards.

Figure 2:
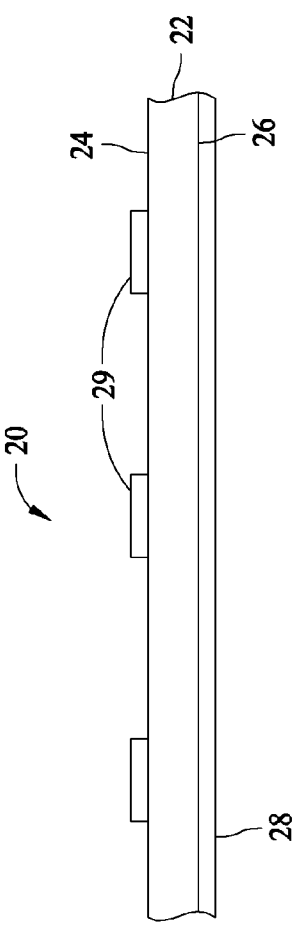
FIG. 2 shows a printed circuit board (PCB)

FIG. 2 shows a printed circuit board (PCB) 20 including a layer 22 and a copper plane 28 disposed thereon. Layer 22 has a top surface 24 and a bottom surface 26. Copper plane 28 is attached to, and is coincident with, bottom surface 26 of layer 22. PCB 20 also includes a plurality of contact pads 29 attached to top surface 24 of layer 22. Generally, the number of contact pads 29 corresponds to the number of solder balls 19.

Figure 3:
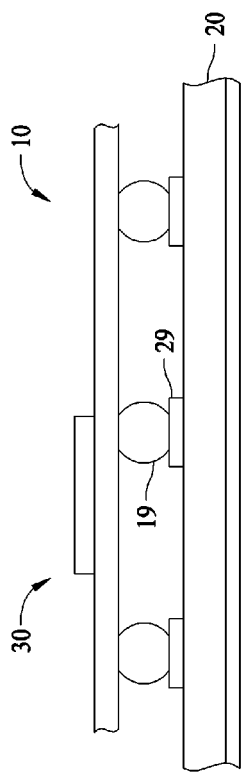
FIG. 3 shows a first assembly comprised of the BGA package and the PCB.

FIG. 3 shows a first assembly 30 including BGA package 10 and PCB 20. Specifically, solder balls 19 of BGA package 10 are attached to contact pads 29 of PCB 20. Solder balls 19 of BGA package 10 are reflowed such that each solder ball 19 attaches to a corresponding contact pad 29 located on PCB 20, thus attaching BGA package 10 to PCB 20.

Figure 4:
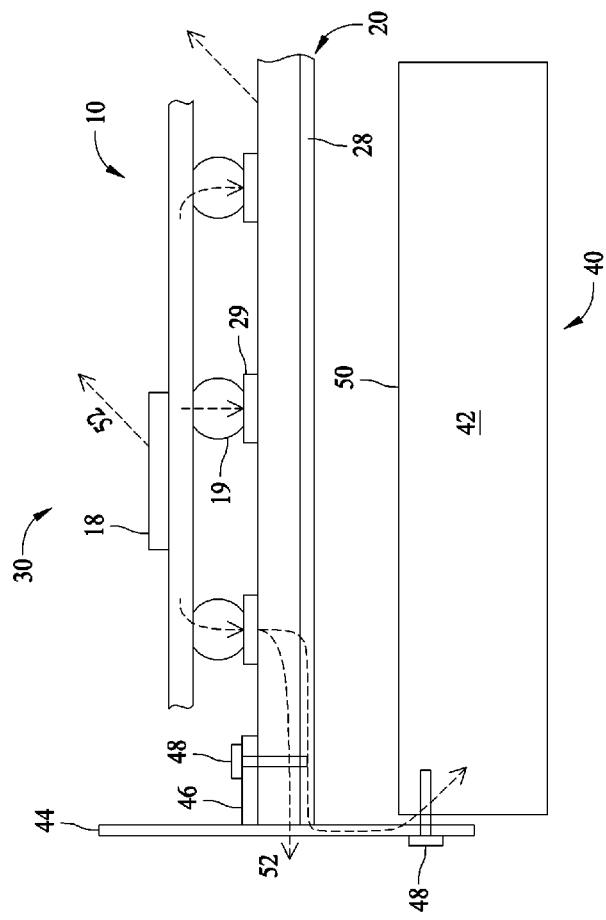
FIG. 4 shows a second assembly comprised of the first assembly attached to a chassis.

FIG. 4 shows a second assembly 40 comprising first assembly 30 attached to a chassis 42. Chassis 42 is generally a connector attached to a surface capable of housing and supporting assembly 30, such as, but not limited to, a CPU surface. As shown, a front panel supporting member 44, having a cantilever 46, is mechanically attached to chassis 42 and PCB 20 of first assembly 30 using screws 48. Thus, disposing first assembly 30 such that copper plane 28 is parallel to and spaced apart from upper surface 50 of chassis 42.

During operation, electronic device 18 generates heat that must be dissipated. Consequently, a variety of cooling techniques have been developed using active and passive heat-sinks comprised of highly thermally conducting materials, such as aluminum and copper. FIG. 4 shows heat paths throughout second assembly 40 using dashed arrows 52. Arrows 52 represent heat migrating from electronic device 18. The heat primarily migrates to copper plane 28 and chassis 42 where it is released into the ambient air.

FIG. 5 shows a blown-up cross-sectional view of first assembly 30. Solder balls 19 of BGA package 10 are attached to pads 29 of PCB 20. Vias 54 are attached to pads 29 and extend from a solder ball 19 through layer 22 of PCB 20. Vias 54 contact inner copper traces and/or planes. Copper traces 55 are disposed on the outer surfaces of PCB 20, including top surface 24, and have a trace width "W" and a trace-to-pad spacing "S". The diameter of ball pad 29 is designated "A". Because of PCB 20 manufacturing limitations, a certain distance "S" must be maintained between ball pad 20 and outer-surface copper traces 55. Copper traces 55 typically fill the available surface area underneath BGA package 10 and prevent the outer-surface copper from being used as a heat conducting path. Vias 54 facilitate heat conduction throughout first and second assemblies 30, 40. Specifically, vias 54 facilitate heat conduction from substrate 12 through solder balls 19, through pads 29 and layer 22 of PCB 20 and into copper plane 28 where the heat is released to the ambient air. The heat is conducted through the materials along this path to surfaces that release heat to ambient non-flowing air (for example through the front panel of a VME SBC) and to ambient air flowing across PCB 20 and system chassis mechanical structure 42. These thermal dissipation systems yield a known thermal conduction value and related efficiency. The efficiency of these systems could be improved by disposing a system of heat conducting passages within PCB 20.

FIG. 6 shows a blown-up cross-sectional view of first assembly 30, including a plurality of microfluidic nano-tubes 56. In the exemplary embodiment, each microfluidic nano-tube 56 is made from carbon fibers and has a circular cross sectional shape defining an exterior surface 58. Each microfluidic nano-tube 56 is embedded within layer 22 of PCB 20 in an area 60. The area 60 is bordered by a pair of vias 54 and top 24 and bottom 26 surfaces of layer 22. Nano-tubes 56 are located within area 60 and between vias 54 and top 24 and bottom 26 surfaces of layer 22, such that a minimum thermal distance 62 between exterior surface 58 of each nano-tube 56 and respective vias 54 of area 60 is maintained. It should be appreciated that although nano-tubes 56 in the exemplars embodiment have a circular cross-sectional shape, other various exemplary embodiments may use other cross-sectional shapes capable of performing the invention. Other cross-sectional shapes that may, be used include, but are not limited to square, rectangle and oval. Additionally, although microfluidic nano tubes 56 are made from carbon fibers in the exemplary embodiment, it should be appreciated that nano tubes 56 may be made from other materials appropriate for practicing the invention.

FIG. 7 shows a top view of first assembly 30, including solder balls 19, nano-tubes 56 embedded within PCB 20 and a heat-sink 64. Heat-sink 64 is disposed on top surface 24 of PCB 20, but at a different location than BGA package 10, and is not required to be in direct contact with electronic device 18. As illustrated, the plurality of microfluidic nano-tubes 56 form a microfluidic nano-tube system 66 embedded in PCB 20, thus creating an in-board heat-sink structure 100 directly under BGA package 10. It should be appreciated that although the exemplary, embodiment describes nano-tubes 56 positioned within area 60 and parallel to each other, nano-tubes 56 may be positioned within area 60 in any manner that maintains minimum distance 62, and in an), configuration in addition to parallel, that enables in-board heat-sink structure 100 to function as described herein. Moreover, it should be appreciated that although the exemplary embodiment includes nano-tubes 56 embedded within PCB 20 as a heat dissipating means, other embodiments may use any kind of piping system heat dissipating means contained within PCB 20 that enables in-board heat-sink structure 100 to function as described herein.

In the exemplary embodiment, a fluid 68 flows by convection into in-board heat-sink structure 100 at entrance 70 through microfluidic nano-tube system 66 of the in-board heat-sink structure and then flows into heat-sink 64. As fluid 68 flows through microfluidic nano-tube system 66, it functions as a heat transfer medium by absorbing and moving heat away from the entire first assembly 30, including electrical device 18, to heat-sink 64. Heat sink 64 dissipates the heat by releasing it into the ambient air through convection or conduction. Convection involves using a fan to blow air across heat sink 64 for facilitating the release of heat into the ambient air. Conduction involves heat migrating to heat sink 64 where it is released to the ambient air. Because microfluidic nano-tube system 66 is embedded within layer 22 of PCB 20, microfluidic nano-tube system 66 does not occupy limited PCB 20 space. Additionally, the exemplary, embodiments do not depend on metallic conducting paths to transfer heat from electronic device 18 to a heat sink. It should be appreciated that fluid 68 may be any fluid capable of practicing the invention, such as water.

Flowing fluid 68 within PCB 20 more efficiently conducts heat away from BGA package 10 to heat sink 64 than other cooling systems because the in-board heat-sink structure avoids creating hot spots and does not reduce available mounting area or conductor area, among other benefits. In the exemplary embodiment, the heat sink 64 is a PCB-mounted heat-sink. It should be appreciated that heat-sink 64 may be any alternate structure capable of dissipating heat, such as, but not limited to a metal frame mounted on PCB 20 or a heat sinking structure off of PCB 20. When using PCB-mounted heat sink as heat sink 64, a fan blows air across heat sink 64 for facilitating the release of heat into the ambient air, but relying on ambient air currents for heat dissipation is acceptable. When using an alternate metal structure as heat sink 64, heat migrates to metal structure 64 and releases to the ambient air.

Figure 8:
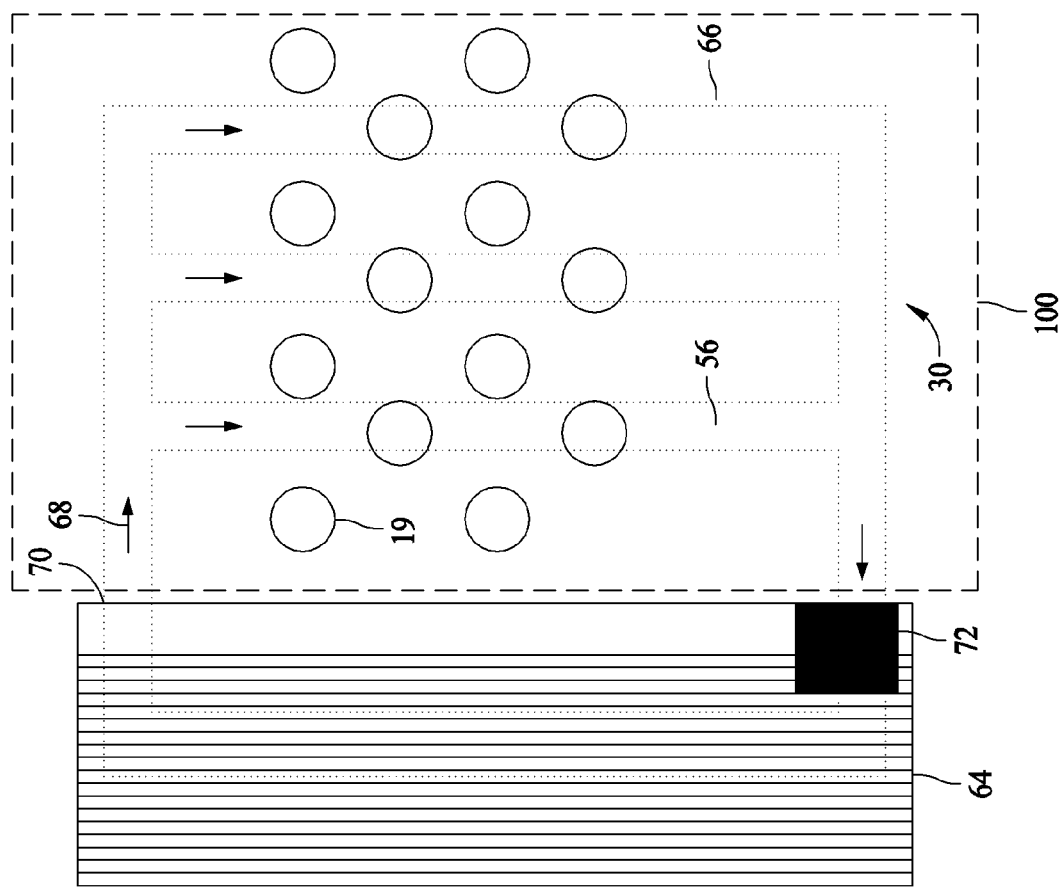
FIG. 8 shows a top view of the first assembly, including a nano-tube system a heat sink and a pump.

It should be further appreciated that in various other exemplary embodiments, other means for circulating fluid 68 through microfluidic nano-tube system 66 may be provided. FIG. 8 shows a top view of first assembly 30 including solder balls 19, microfluidic nano-tube system 66 embedded within PCB 20, heat-sink 64 and a pump 72. In the exemplary embodiment shown in FIG. 8, fluid 68 functions in the same wavy as described regarding FIG. 7, but fluid 68 is driven through microfluidic nano-tube system 66 by a pump 72. Pump 72 may be an electro-kinetic pump and is coupled to microfluidic nano-tube system 66 for facilitating heat transfer from BGA package 10 to heat sink 64. It should be appreciated that in other various exemplary embodiments, any type of pump 72 may be used that is able to circulate fluid 68 through microfluidic nano-tube system 66.

In the exemplary embodiment, layer 22 of PCB 20 is comprised of FR4, a dielectric material. It should be appreciated that in other various exemplary embodiments, layer 22 may be made from other materials, such as a thermally conductive plastic material. A thermally conductive plastic material further facilitates thermal contact from solder balls 19 of BGA package 10 to the in-board heat sink structure.

Described herein are exemplary embodiments of methods and systems for extracting heat from at least one BGA package 10 electronic device 18 more efficiently through PCB 20, using a microfluidic nano-tube heat-pipe system 66 embedded in layer 22 of PCB 20. As described herein, the methods permit greater heat flow through PCB 20 material using circulating fluid 68 as a heat carrier flowing through a microfluidic nano-scale heat-pipe system 66 created within PCB 20. The heat generated by at least one electronic device 18 can be transferred from electronic device 18 to a heat sink 64 disposed in a different region of PCB 20 without using a metallic conducting heat path. Heat-sink 64 radiates the heat to the ambient air or to a different region of PCB 20 where the heat is conducted to an existing mechanical structure such as a box or chassis 42. The heat may also be spread throughout the area of PCB 20 and radiated to the ambient air to remove "hotspots".

The embodiments described herein do not interfere with signal routing on the copper layers of PCB 20, thus increase the amount of copper lagers used exclusively for signal routing. Additionally, each exemplary embodiment provides better thermal conducting paths due to the circulating heat-carrying fluid than is obtained with other thermally conductive dielectric materials. Further, it should be well understood that electronic devices other than BGA package 10 may be a source of heat in an embedded computer system or other electronic system incorporating printed circuit boards 20. Such heat generating devices may also be cooled using in-board heat pipe structure 100.

While the invention has been described in terms of various specific embodiments, those skilled in the art will recognize that the invention can be practiced with modification within the spirit and scope of the claims.

What is claimed is:

1. A system for extracting heat from an electronic device, said system comprising:
    an in-board heat sink structure positioned within a printed circuit board, said in-board heat sink structure comprising a microfluidic nano-tube system comprising a plurality of microfluidic nano-tubes;
    a ball grid array package attached to said printed circuit board, said ball grid array package comprising a plurality of solder balls attached to corresponding contact pads, said contact pads attached to corresponding vias that extend from the corresponding solder balls through a dielectric plane in the printed circuit board to a copper plane, at least one microfluidic nano-tube of the plurality of microfluidic nano-tubes embedded within the dielectric plane between adjacent vias; and
    a fluid heat transfer medium channeled through said in-board heat sink structure, wherein said fluid heat transfer medium flows into said in-board heat sink structure at a single entrance and circulates through said in-board heat sink structure carrying heat away from the electronic device.

2. A system in accordance with claim 1 further comprising a heat sink comprising at least one of a printed circuit board mounted heat sink, a metal frame mounted on said printed circuit board, and a heat sinking structure disposed on a structure separate from said printed circuit board.

3. A system in accordance with claim 1 wherein said in-board heat sink structure is located to maintain a minimum thermal distance between a via and an exterior surface of said in-board heat sink structure.

4. A system in accordance with claim 1 wherein said in-board heat sink structure is disposed directly under the ball grid array package.

5. A system in accordance with claim 1 wherein the heat is released into the ambient air using one of conduction and convection.

6. A system in accordance with claim 1 wherein said printed circuit board is fabricated from thermally conductive plastic and said plurality of microfluidic nano-tubes are fabricated from carbon fibers.

7. A system in accordance with claim 1, wherein said plurality of microfluidic nano-tubes are connected such that said microfluidic nano-tube system forms a single continuous circuit through which said fluid heat transfer medium flows.

8. A method for extracting heat from an electronic device, the method comprising:
    positioning an in-board heat sink structure within a printed circuit board, the in-board heat sink structure including a plurality of interconnected microfluidic nano-tubes;
    attaching a ball grid array package to the printed circuit board, the ball grid array package comprising a plurality of solder balls attached to corresponding contact pads, the contact pads attached to corresponding vias that extend from the corresponding solder balls through a dielectric plane in the printed circuit board to a copper plane;
    embedding at least one microfluidic nano-tube of the plurality of interconnected microfluidic nano-tubes within the dielectric plane between adjacent vias; and
    channeling a fluid heat transfer medium through the in-board heat sink structure, wherein the fluid heat transfer medium enters the in-board heat sink structure through a single entrance and circulates through the in-board heat sink structure and into a heat sink.

9. A method in accordance with claim 8 further comprising positioning the heat sink with respect to the printed circuit board, the heat sink includes at least one of a printed circuit board mounted heat sink, a metal frame mounted on the printed circuit board, and a heat sinking structure disposed on a structure separate from the printed circuit board.

10. A method in accordance with claim 8 further comprising locating the plurality of microfluidic nano-tubes to maintain a minimum thermal distance between a via and an exterior surface of the plurality of microfluidic nano-tubes.

11. A method in accordance with claim 8 further comprising locating the in-board heat sink structure directly under the ball grid array package.

12. A method in accordance with claim 8 further comprising releasing the heat into the ambient air using one of conduction and convection.

13. A method in accordance with claim 8 wherein positioning the in-board heat sink structure comprises forming the plurality of microfluidic nano-tubes from carbon fibers within the printed circuit board that is fabricated from thermally conductive plastic.

14. A heat dissipation system comprising:
    a microfluidic nano-tube system positioned within a printed circuit board, said microfluidic nano-tube system comprising a plurality of interconnected microfluidic nano-tubes;
    a ball grid array package attached to said printed circuit board, said ball grid array package comprising a plurality of solder balls attached to corresponding contact pads, said contact pads attached to corresponding vias that extend from said corresponding solder balls through a dielectric plane in said printed circuit board to a copper plane, at least one microfluidic nano-tube of the plurality of interconnected microfluidic nano-tubes embedded within the dielectric plane between adjacent vias; and
    a fluid transfer medium channeled through said microfluidic nano-tube system, wherein said fluid transfer medium flows into said microfluidic nano-tube system at a single entrance and circulates through said microfluidic nano-tube system and into a heat sink.

15. A system in accordance with claim 14 wherein said heat sink comprises at least one of a printed circuit board mounted heat sink, a metal frame mounted on said printed circuit board, and a heat sinking structure disposed on a structure separate from said printed circuit board.

16. A system in accordance with claim 14 wherein said microfluidic nano-tube system is located to maintain a minimum thermal distance between a via and an exterior surface of each of said plurality of interconnected microfluidic nano-tubes.

17. A system in accordance with claim 14 wherein the heat is released into the ambient air using one of conduction and convection.

18. A system in accordance with claim 14 wherein said printed circuit board is fabricated from thermally conductive plastic and each of said plurality of interconnected microfluidic nano-tubes is fabricated from carbon fibers.

19. A system in accordance with claim 14 wherein said printed circuit board is disposed directly under the ball grid array package.

* * * * *